US008319757B2

(12) United States Patent
Choi

(10) Patent No.: US 8,319,757 B2
(45) Date of Patent: Nov. 27, 2012

(54) DISPLAY APPARATUS AND CONTROL METHOD THEREOF

(75) Inventor: Young-hun Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1050 days.

(21) Appl. No.: 12/031,219

(22) Filed: Feb. 14, 2008

(65) Prior Publication Data

US 2009/0027365 A1 Jan. 29, 2009

(30) Foreign Application Priority Data

Jul. 23, 2007 (KR) ........................ 10-2007-0073635

(51) Int. Cl.
*G06F 30/38* (2006.01)

(52) U.S. Cl. ........................................................ 345/204

(58) Field of Classification Search .................. 345/204, 345/421, 602; 709/211, 214; 382/294; 725/145; 348/14.08
See application file for complete search history.

(56) References Cited

U.S. PATENT DOCUMENTS

| | | | | |
|---|---|---|---|---|
| 5,630,174 | A * | 5/1997 | Stone et al. | 710/63 |
| 6,373,476 | B1 * | 4/2002 | Dalgleish et al. | 345/204 |
| 6,618,773 | B1 | 9/2003 | Chang et al. | |
| 6,839,055 | B1 * | 1/2005 | Nguyen | 345/204 |
| 7,358,928 | B2 * | 4/2008 | Mori et al. | 345/1.1 |
| 7,952,748 | B2 * | 5/2011 | Voltz et al. | 358/1.2 |
| 2001/0050679 | A1 * | 12/2001 | Shigeta | 345/204 |
| 2003/0025685 | A1 * | 2/2003 | Shirasaki et al. | 345/204 |
| 2003/0214507 | A1 | 11/2003 | Mawatari et al. | |
| 2004/0027357 | A1 | 2/2004 | Mendelson et al. | |
| 2004/0027515 | A1 | 2/2004 | Itakura | |
| 2004/0036697 | A1 * | 2/2004 | Kim et al. | 345/617 |
| 2005/0062735 | A1 * | 3/2005 | Kim | 345/204 |
| 2005/0232030 | A1 * | 10/2005 | Mawatari et al. | 365/189.05 |
| 2006/0082569 | A1 | 4/2006 | Noorbakhsh et al. | |
| 2006/0092152 | A1 * | 5/2006 | Jang et al. | 345/211 |
| 2008/0100641 | A1 * | 5/2008 | Frederick et al. | 345/619 |

FOREIGN PATENT DOCUMENTS

| | | | |
|---|---|---|---|
| KR | 10-2005-0029615 | A | 3/2005 |
| WO | 2006/059868 | A1 | 6/2006 |

OTHER PUBLICATIONS

"Display switch with dedicated extended display identification data information" Research Disclosure, Mason Publications, GB, vol. 508, No. 89, Aug. 1, 2006, 2 pages. XP007136552.
Communication dated Sep. 15, 2011 issued by the European Patent Office in counterpart European Patent Application No. 08153680.7.
Communication dated Aug. 23, 2012 from the European Patent Office in counterpart European application No. 08153680.7.

* cited by examiner

*Primary Examiner* — Abbas Abdulselam
(74) *Attorney, Agent, or Firm* — Sughrue Mion, PLLC

(57) ABSTRACT

A display apparatus and a control method thereof are provided. The display apparatus is coupled to a video signal supply source through at least one connector. The display apparatus includes: a main storage unit which stores extended display identification data (EDID) therein corresponding to the at least one connector; a temporary storage unit which loads the EDID thereto from the main storage unit; and a controller which loads the EDID stored in the main storage unit to the temporary storage unit if power is supplied, and controls to transmit the EDID corresponding to an EDID requesting signal, among the EDID loaded to the temporary storage unit, through the at least one connector if the EDID requesting signal is received through the at least one connector.

13 Claims, 3 Drawing Sheets

DISPLAY APPARATUS AND CONTROL METHOD THEREOF

CROSS-REFERENCE TO RELATED APPLICATIONS

This application claims priority from Korean Patent Application No. 10-2007-0073635, filed on Jul. 23, 2007, in the Korean Intellectual Property Office, the disclosure of which is incorporated herein by reference.

BACKGROUND OF THE INVENTION

1. Field of Invention

Apparatuses and methods consistent with the present invention relate to a display apparatus and a control method thereof, and more particularly, to a display apparatus which transmits extended display identification data (EDID) corresponding to a connector coupled to a video signal supply source, and a control method thereof.

2. Related Art

A display apparatus receives a video signal from a video processing apparatus or a video signal supply source to display the video signal thereon. The related art plug and play display apparatus exchanges information with the video signal supply source. If the plug and play display apparatus is connected with the video signal supply source through a connector, the video signal supply source automatically reconfigures and optimizes a user environment with respect to the display apparatus.

To perform such a function, extended display identification data (EDID) including information on the display apparatus is stored in the display apparatus. The stored EDID is transmitted to the video signal supply source through the connector. The EDID may be transmitted to the video signal supply source according to display data channel (DDC) defined by video electronics standards association (VESA).

The related art display apparatus includes a plurality of ports to be connected with a plurality of connectors. Each port includes an electrically erasable and programmable read only memory (EEPROM) storing the EDID corresponding to each connector. If each port is connected with the corresponding connector and receives the EDID through the connector, the EDID is supplied to the video signal supply source from the EEPROM of the port through the connector.

However, the related art display apparatus should have the EEPROMs therein corresponding to the connectors, leading to increase in the number of EEPROMs. Thus, production costs may also rise, and an internal configuration of the display apparatus may become complicated.

Further, EDID should be written to the plurality of EEPROMs, respectively, during a production process. Thus, a manufacturer should change EEPROMs in every writing process, which may require additional time.

SUMMARY OF THE INVENTION

The present invention provides a display apparatus which can simplify EDID management and transmission, instead of having EEPROMs storing EDID therein for each of connectors, and a control method thereof.

The present invention also provides a display apparatus which simplifies an EDID writing process of an overall manufacturing process, and a control method thereof.

According to an aspect of the present invention, there is provided a display apparatus which is connected with a video signal supply source through at least a connector, the display apparatus including: a main storage unit which stores EDID therein corresponding to the plurality of connectors; a temporary storage unit which loads the EDID thereto from the main storage unit; and a controller which loads the EDID stored in the main storage unit to the temporary storage unit if power is supplied, and controls to transmit the EDID corresponding to an EDID requesting signal, among the EDID loaded to the temporary storage unit, through the connector if the EDID requesting signal is received through the connector.

The display apparatus may further include an arbiter which transmits the EDID loaded to the temporary storage unit to the respective connectors corresponding to the EDID requesting signals through the plurality of connectors.

The controller may receive power from at least one of the display apparatus and the connectors.

The EDID stored in the main storage unit may be transmitted to the temporary storage unit through an interface including I2C port or RS232 port.

The main storage unit may store a plurality of EDID therein corresponding to the single connector, and the display apparatus may further include: a user selection unit which is provided to select one of the plurality of EDID.

The display apparatus may further include a user interface (UI) setting unit which displays a selection item on the plurality of EDID to be selected through the user selection unit.

The controller may load the EDID selected by the user selection unit among the plurality of EDID corresponding to the single connector, from the main storage unit to the temporary storage unit.

According to another aspect of the present invention, there is provided a control method of a display apparatus which is connected with a video signal supply source through at least a connector, the control method including: loading EDID corresponding to the plurality of connectors from a main storage unit of the display apparatus to a temporary storage unit of the display apparatus if power is supplied; and transmitting the EDID corresponding to an EDID requesting signal among the EDID loaded to the temporary storage unit, to the video signal supply source through the connector if the EDID requesting signal is transmitted from the connector.

The display apparatus may further include an arbiter which transmits the EDID loaded to the temporary storage unit to the respective connectors corresponding to the EDID requesting signals supplied by the plurality of connectors.

The loading the EDID may include receiving power from at least one of the display apparatus and the connectors.

The EDID stored in the main storage unit may be transmitted to the temporary storage unit through an interface including I2C port or RS232 port.

The control method may further include: selecting one of a plurality of EDID through a user selection unit of the display apparatus before loading the EDID if the plurality of EDID is stored in the main storage unit corresponding to a single connector, and the loading the EDID may include loading the EDID selected from the plurality of EDID to the temporary storage unit.

The display apparatus may further include a UI setting unit which displays a selection item on the plurality of EDID to be selected by the user selection unit.

BRIEF DESCRIPTION OF THE DRAWINGS

The above and/or other aspects of the present invention will become apparent and more readily appreciated from the following description of the exemplary embodiments, taken in conjunction with the accompanying drawings of which.

DETAILED DESCRIPTION OF EXEMPLARY EMBODIMENTS OF THE INVENTION

Hereinafter, exemplary embodiments of the present invention will be described with reference to accompanying drawings, wherein like numerals refer to like elements, and repetitive descriptions will be avoided as necessary.

Figure 1:
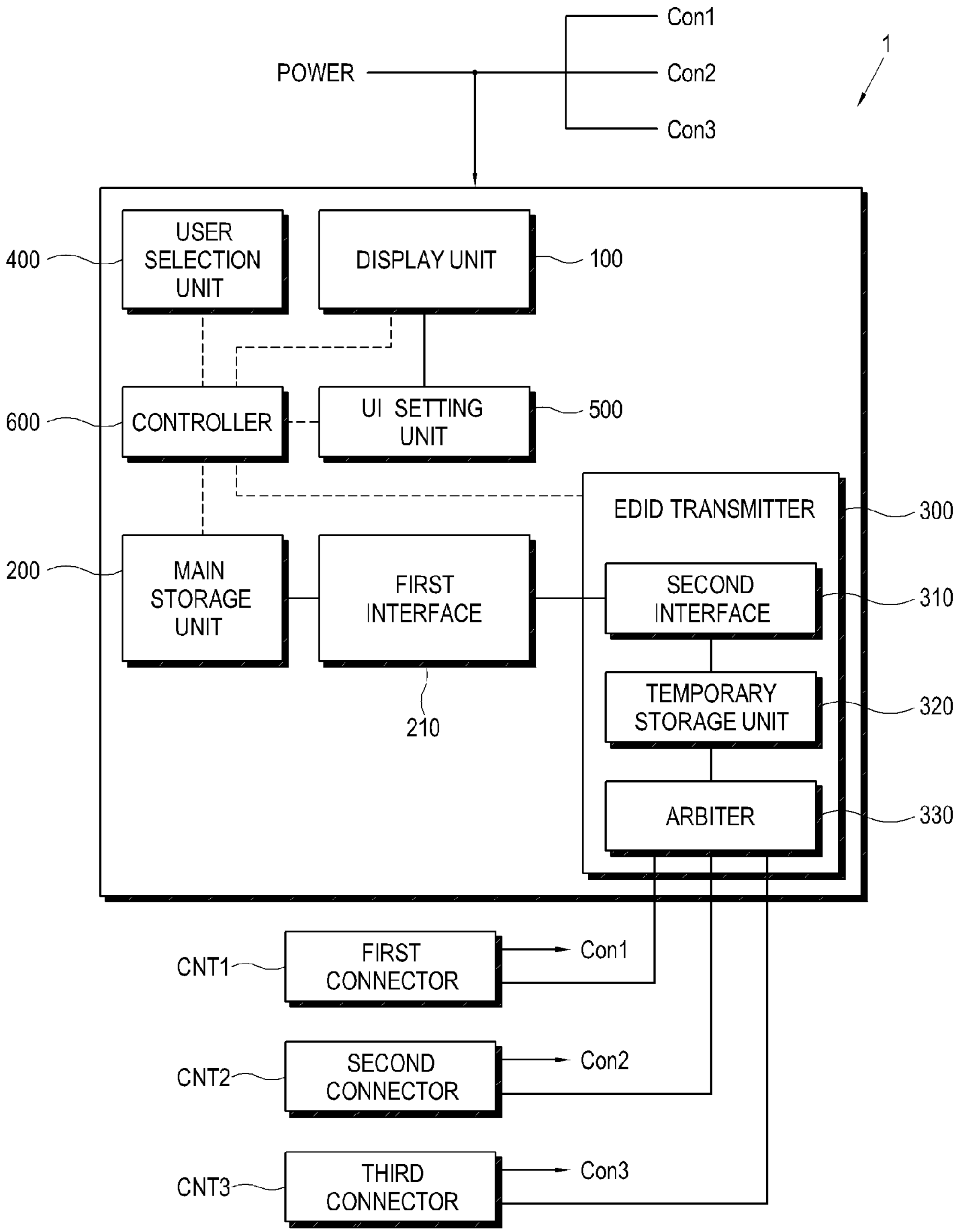
FIG. 1 is a block diagram of a display apparatus according to an exemplary embodiment of the present invention.

As shown in FIG. 1, a display apparatus 1 according to an exemplary embodiment is coupled to connectors CNT1, CNT2 and CNT3 which are coupled to at least one video signal supply source (not shown). The video signal supply source communicates with the display apparatus 1 through various interfaces including high definition multimedia interface (HDMI), a digital visual interface (DVI), a personal computer, or the like, but are not limited thereto. The display apparatus 1 includes a port (not shown) to which the connectors CNT1, CNT2 and CNT3 are connected, so as to communicate with the video signal supply source.

The video signal supply source receives EDID which includes information on resolution, horizontal frequency, vertical frequency, manufacturer's ID, product name and display power management signaling (DPMS) supported by the display apparatus 1 to transmit an optimal video signal that is displayable on the display apparatus 1. The EDID is stored in the display apparatus 1. If connected with the connectors CNT1, CNT2 and CNT3 and receiving an EDID requesting signal from the video signal supply source, the display apparatus 1 transmits the EDID to the video signal supply source through the connectors CNT1, CNT2 and CNT3.

The connectors CNT1, CNT2 and CNT3 may transmit the electrical signal between the video signal supply source and the display apparatus 1, and at the same time, power may be supplied from the video signal supply source to the display apparatus 1 through the connectors CNT1, CNT2 and CNT3.

The display apparatus 1 includes a display unit 100 which displays a video image thereon, a main storage unit 200 which stores various programs and data including the EDID therein, and an EDID transmitter 300 which transmits the EDID to the connectors CNT1, CNT2 and CNT3.

The EDID may be plurally provided (e.g., in parallel) corresponding to the single video signal supply source and one of the connectors CNT1, CNT2 and CNT3 coupled to the video signal supply source. In this case, the display apparatus 1 may further include a user selection unit 400 to select one of the plurality of EDID, and a user interface (UI) setting unit 500 to display a selection item on the plurality of EDID on the display unit 100.

The display apparatus 1 further includes a controller 600 which controls the foregoing elements when power is supplied. The display apparatus 1 receives power from an external power source connected therewith. Also, the display apparatus 1 may receive power from the video signal supply source through the connectors CNT1, CNT2 and CNT3 if coupled to the connectors CNT1, CNT2 and CNT3.

The display unit 100 displays an image thereon corresponding to the received video signal. The display unit 100 may employ various related art display devices such as a digital light processing (DLP) projector, a liquid crystal display (LCD) and a plasma display panel (PDP).

The display unit 100 displays the selection item on the plurality of EDID thereon by the UI setting unit 500. Then, a user may select one of the plurality of EDID through the user selection unit 400.

The main storage unit 200 stores data and driver programs therein to drive the display apparatus 1. The main storage unit 200 may include a non volatile flash ROM to store the programs and data therein even if the display apparatus 1 is turned off.

In addition to the programs and data, the main storage unit 200 stores EDID therein corresponding to the plurality of connectors CNT1, CNT2 and CNT3 connected with the display apparatus 1. If the display apparatus 1 is turned on, the EDID stored in the main storage unit 200 is loaded to the EDID transmitter 300. The main storage unit 200 includes a first interface 210 to transmit the EDID to the EDID transmitter 300.

The first interface 210 transmits the EDID stored in the main storage unit 200 to the EDID transmitter 300, specifically to a second interface 310 (as explained below). The first interface 210 may transmit the EDID to the second interface 310 according to, e.g. I2C port or RS232 port. I2C is a serial bus and a two wire interface between devices. I2C includes a serial clock (SCL) as a control line and a serial address/data (SDA) as a data line, and supports bi-directional communication between devices. RS232C is a recommended standard equipped in a PC, has a small number of wires and is easy to realize communication programming, but enables only a serial communication.

The EDID transmitter 300 is electrically coupled to the connectors CNT1, CNT2 and CNT3 connected with the display apparatus 1. If power is supplied, the EDID stored in the main storage unit 200 is loaded by the EDID transmitter 300. If the EDID requesting signal is supplied by the video signal supply source through the connectors CNT1, CNT2 and CNT3, the EDID transmitter 300 transmits the EDID corresponding to the supplied EDID requesting signal to the connectors CNT1, CNT2 and CNT3. Then, the video signal supply source performs a routine to optimize the user environment of the display apparatus 1 based on the EDID supplied through the connectors CNT1, CNT2 and CNT3.

To perform the foregoing operation, the EDID transmitter 300 includes the second interface 310 which receives the EDID from the first interface 210, a temporary storage unit 320 which stores the EDID supplied through the second interface 310 therein and an arbiter 330 which transmits the EDID stored in the temporary storage unit 320 to the respective connectors CNT1, CNT2 and CNT3 corresponding to the EDID requesting signals respectively supplied by the connectors CNT1, CNT2 and CNT3.

The second interface 310 forms an I2C port or RS232 port line together with the first interface 210, allowing the EDID to be loaded from the main storage unit 200 to the temporary storage unit 320.

The temporary storage unit 320 stores the EDID supplied through the second interface 310 therein. The temporary storage unit 320 may include a volatile random access memory (RAM) which loses data if power is turned off, but is not limited thereto. If power is turned off, the data of the temporary storage unit 320 is erased. If power is supplied, the EDID stored in the main storage unit 200 is loaded and stored in the temporary storage unit 320. Thus, the data of the temporary storage unit 320 does not need to be erased to load the EDID stored in the main storage unit 200 to the temporary storage unit 320, if power is supplied.

The temporary storage unit 320 stores the EDID corresponding to the connectors CNT1, CNT2 and CNT3 or the EDID requesting signals therefrom, per memory address. For example, it is presumed that the EDID corresponding to the respective connectors CNT1, CNT2 and CNT3 are stored in the main storage unit 200. The memory addresses from 0 to 255 of the temporary storage unit 320 store the EDID corresponding to the first connector CNT1, memory addresses from 256 to 511 store the EDID corresponding to the second connector CNT2 and the memory addresses from 512 to 767 store the EDID corresponding to the third connector CNT3. If the connectors CNT1, CNT2 and CNT3 transmit EDID requesting signals respectively, the arbiter 330 accesses the temporary storage unit 320 based on the memory addresses to transmit the EDID to the connectors CNT1, CNT2 and CNT3.

If the plurality of connectors CNT1, CNT2 and CNT3 supplies the EDID requesting signals respectively, the arbiter 330 reads the EDID from the temporary storage unit 320 and transmits the EDID to the CNT1, CNT2 and CNT3, respectively. If the EDID requesting signals are substantially simultaneously supplied, the arbiter 330 processes the signals sequentially.

The arbiter 330 accesses the EDID loaded to the temporary storage unit 320 based on the memory addresses corresponding to the supplied EDID requesting signals to improve speed and efficiency. For example, it is presumed that the second connector CNT2 transmits the EDID requesting signal to the arbiter 330. The EDID corresponding to the second connector CNT2 is stored in the memory addresses from 256 to 511 of the temporary storage unit 320. The arbiter 330 then accesses the memory addresses from 256 to 511 and transmits the EDID at the concerned memory addresses to the second connector CNT2, instead of accessing the memory addresses from zero to 511. Thus, the arbiter 330 transmits the EDID faster corresponding to the EDID requesting signals of the connectors CNT1, CNT2 and CNT2. For example, but not by way of limitation, workload may be substantially decreased.

The main storage unit 200 may store a plurality of EDID, e.g. several versions of EDID therein corresponding to one of the connectors CNT1, CNT2 and CNT3. In this case, the latest version of the plurality of EDID is automatically loaded to the temporary storage unit 320. Alternatively, a user may select from the several versions of EDID.

The user selection unit 400 is provided to select one of the selection items on the plurality of EDID displayed on the display unit 100. The user selection unit 400 may include a menu button (not shown) disposed in the display apparatus 1, or a remote controller.

The UT setting unit 500 displays the selection items on the plurality of EDID corresponding to one of the connectors CNT2, CNT2 and CNT3, on the display unit 100. A user may activate the UT setting unit 500 and select one of the displayed selection items through the user selection unit 400 as necessary.

If power is supplied to the display apparatus 1, the controller 600 reads the EDID among the data stored in the main storage unit 200, and loads the EDID to the EDID transmitter 300, specifically, to the temporary storage unit 320. The controller 600 stores the EDID corresponding to the respective connectors CNT1, CNT2 and CNT3 in the temporary storage unit 320 based on the preset memory addresses. The arbiter 330 may effectively access the temporary storage unit 320 corresponding to the EDID requesting signals.

If the EDID is plurally provided corresponding to one of the connectors CNT1, CNT2 and CNT3, the controller 600 controls the UT setting unit 500 to display the selection items on the plurality of EDID on the display unit 100. If a user selects one of the plurality of EDID through the user selection unit 400, the controller 600 registers and stores the information on the selected item in the main storage unit 200. If power is supplied to the display apparatus 1, the controller 600 selects the EDID stored in the main storage unit 200 to be loaded to the temporary storage unit 320. Then, the arbiter 330 may transmit the EDID loaded to the temporary storage unit 320, to one or more of the connectors CNT1, CNT2 and CNT3.

Figure 2:
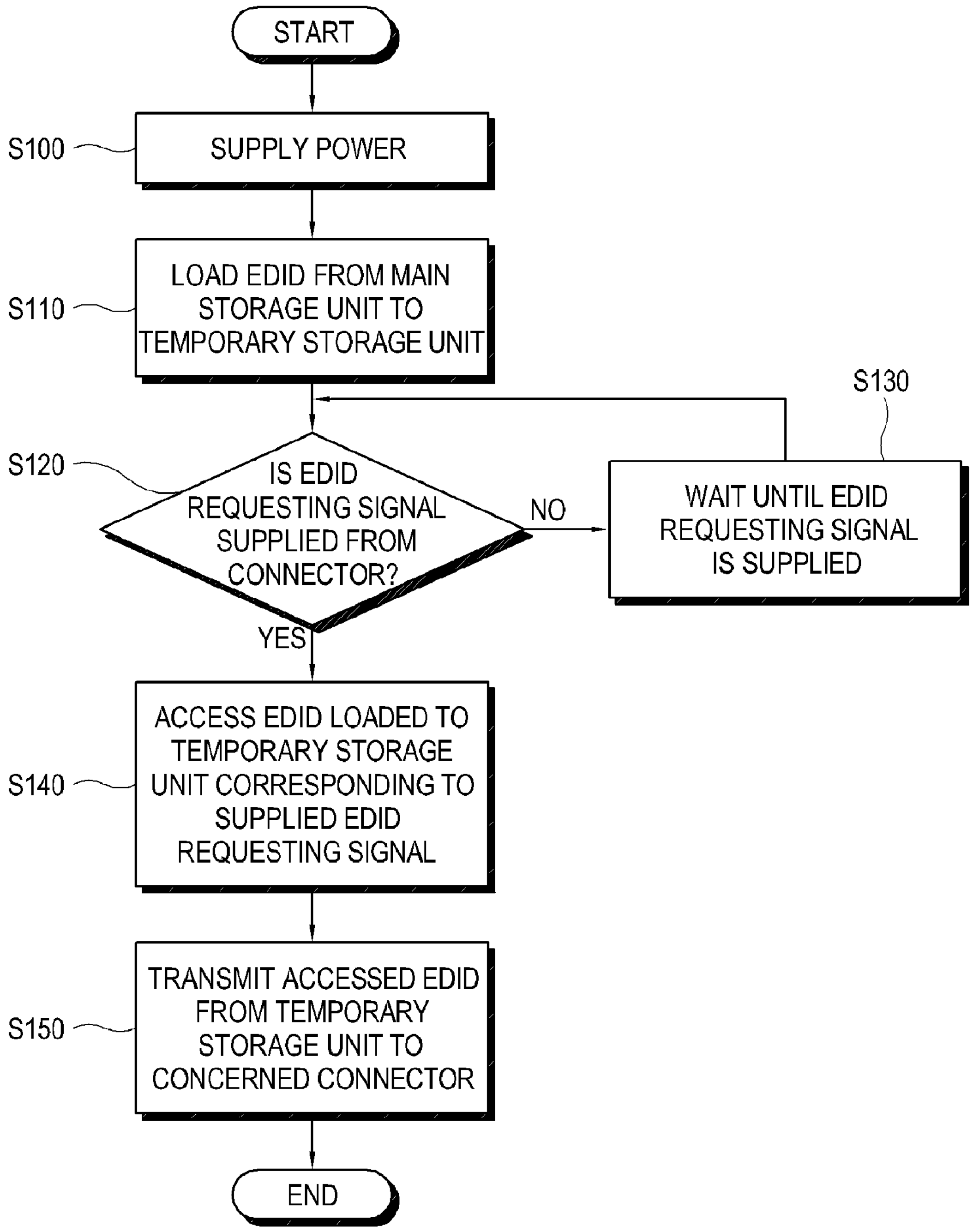
FIG. 2 is a control flowchart of the display apparatus in FIG. 1 according to an exemplary embodiment of the present invention.

With the foregoing configuration, the process of transmitting the EDID by the display apparatus 1 according to the exemplary embodiment will be described with reference to FIGS. 1 and 2. Here, the display apparatus 1 is turned off at an initial stage.

First, power is supplied to the display apparatus 1 (S100). According to the exemplary embodiment, power is supplied to the display apparatus 1 by at least one of the following: (1) the display apparatus 1 is turned on to receive power; (2) the connectors CNT1, CNT2 and CNT3 are connected with the display apparatus 1 and supply power thereto.

If power is supplied to the display apparatus 1, elements such as the controller 600, the main storage unit 200 and the EDID transmitter 300 start operating. The controller 600 reads the EDID stored in the main storage unit 200 and loads the EDID to the temporary storage unit 320 (S110). Here, the controller 600 stores the EDID corresponding to the respective connectors CNT1, CNT2 and CNT3 in the temporary storage unit 320 based on the preset memory addresses.

The arbiter 330 receives the EDID requesting signals from the connectors CNT1, CNT2 and CNT3 (S120). If the EDID requesting signals are not transmitted, the arbiter 330 waits until receiving the signals (S130).

If the EDID requesting signals are transmitted from the connectors CNT1, CNT2 and CNT3, the arbiter 330 accesses the temporary storage unit 320 based on at least the memory addresses corresponding to the EDID requesting signals (S140). The arbiter 330 transmits the accessed EDID from the temporary storage unit 320 to the respective connectors CNT1, CNT2 and CNT3 (S150).

Figure 3:
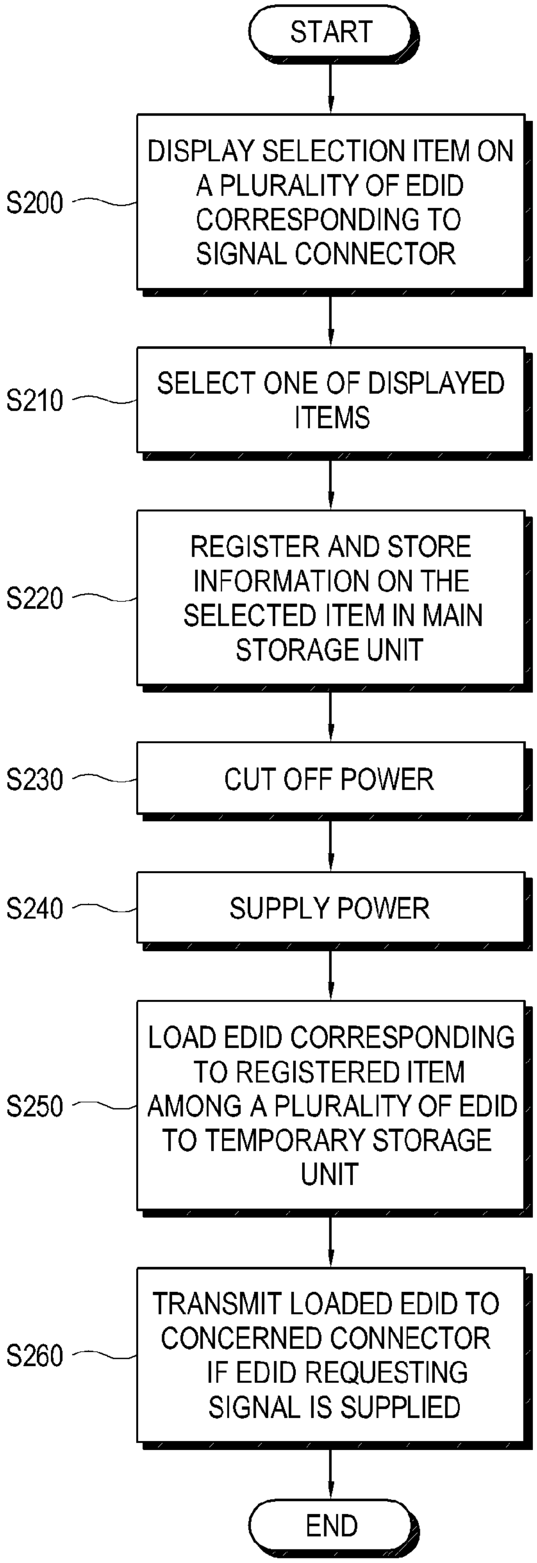
FIG. 3 is a control flowchart of a display apparatus according to another exemplary embodiment of the present invention.

According to the exemplary embodiment, single EDID is stored in the main storage unit 200 corresponding to one of the connectors CNT1, CNT2 and CNT3. According to another exemplary embodiment, however, several versions of the EDID may be stored in the main storage unit 200 corresponding to one of the connectors CNT1, CNT2 and CNT3. Hereinafter, the process of transmitting the EDID having several versions will be described with reference to FIGS. 1 and 3. Here, the display apparatus 1 is turned on and operate at an initial stage.

If the plurality of EDID is stored in the main storage unit 200 corresponding to one of the connectors CNT1, CNT2 and CNT3, a user activates the UI setting unit 500 to display the selection items on the plurality of EDID on the display unit 100 (S200). A user selects one of the items displayed on the display unit 100 through the user selection unit 400 (S210).

The information on the selected item is registered and stored in the main storage unit 200 according to the control of the controller 600 (S220). At this time, the information on the EDID selected by a user is stored in the main storage unit 200 to be recognized by a user. The main storage unit 200 includes the flash ROM to write the information.

Then, the display apparatus 1 is turned off (S230). As the information on the selected EDID is stored in the non-volatile main storage unit 200, the information is not erased when the display apparatus 1 is turned off.

If power is supplied to the display apparatus 1 (S240), the controller 600 refers to the information on the selected EDID registered and stored in the main storage unit 200 before loading the EDID from the main storage unit 200 to the temporary storage unit 320. Among the plurality of EDID corresponding to one of the connectors CNT1, CNT2 and CNT3, the controller 600 loads the EDID corresponding to the item registered in the main storage unit 200, i.e. loads the EDID selected by a user, to the temporary storage unit 320 (S250).

If the EDID requesting signals are transmitted from the connectors CNT1, CNT2 and CNT3, the arbiter 330 transmits the loaded EDID to the concerned connectors CNT1, CNT2 and CNT3 (S260). This operation is substantially the same as that according to the exemplary embodiment described above.

As described above, the display apparatus 1 according to the exemplary embodiment stores the EDID in the main storage unit 200, loads the EDID from the main storage unit 200 to the temporary storage unit 320 if power is supplied, and transmits the EDID loaded to the temporary storage unit 320 to the respective connectors CNT1, CNT2 and CNT3 by the arbiter 330 corresponding to the EDID requesting signals from the connectors CNT1, CNT2 and CNT3.

The above exemplary embodiments may be embodied as a computer program that performs the described exemplary method. Code and code segments of the computer program may be easily derived by computer programmers of ordinary skill in the art to which the present invention pertains. The computer program may be stored in a computer readable medium, and executed using a general digital computer. Examples of the computer-readable medium include a magnetic recording medium (a ROM, a floppy disk, a hard disc, etc.), and an optical recording medium (a CD ROM, a DVD, etc.), but are not limited thereto.

According to the exemplary embodiments, a single memory storing EDID therein is provided, instead of plural memories corresponding to respective connectors, which might simplify an EDID transmission configuration. Further, a plurality of EDID is written in a single memory, which might simplify an EDID writing process in manufacturing processes, and might improve production efficiency. Furthermore, if a plurality of EDID is provided corresponding to a single connector, a user may select the EDID, which might affect application and product credibility. However, the foregoing affects are not necessarily, and these affects, other affects or no effects may be realized without departing from the scope of the invention.

Although exemplary embodiments have been shown and described, it will be appreciated by those skilled in the art that changes may be made in these exemplary embodiments without departing from the principles and spirit of the invention, the scope of which is defined in the appended claims and their equivalents.

What is claimed is:

1. A display apparatus capable of being coupled to plurality of external video signal supply sources through a plurality of connectors, the display apparatus comprising:

a main storage unit at the display apparatus which stores a plurality of extended display identification data units (EDIDs) therein corresponding to the plurality of connectors, respectively;

a temporary storage unit at the display apparatus which stores one or more loaded EDIDs thereto from the main storage unit; and a controller which loads the one or more EDIDs stored in the main storage unit of the display apparatus to the temporary storage unit of the display apparatus if power is supplied, and controls to transmit an EDID corresponding to an EDID requesting signal from the display apparatus to an external video signal supply source coupled to the display apparatus through a corresponding connector, among the one or more EDIDs loaded to the temporary storage unit, through the corresponding connector if the EDID requesting signal is received from the external video signal source through the corresponding connector.

2. The display apparatus according to claim 1, further comprising an arbiter coupled between the temporary storage unit and the plurality of connectors, which transmits the one or more EDIDs loaded to the temporary storage unit to respective ones of the corresponding connector.

3. The display apparatus according to claim 1, wherein the controller receives power from at least one of the display apparatus and the corresponding connector.

4. The display apparatus according to claim 1, wherein the plurality of EDIDs stored in the main storage unit are transmitted to the temporary storage unit through an interface including an I2C port or a RS232 port.

5. The display apparatus according to claim 1, wherein the main storage unit stores the plurality of EDIDs therein corresponding to one of the plurality of connectors, the display apparatus further comprising:

a user selection unit which is provided to select one of the plurality of EDIDs.

6. The display apparatus according to claim 5, further comprising a user interface setting unit which displays a selection item on the plurality of EDIDs to be selected through the user selection unit.

7. The display apparatus according to claim 5, wherein the controller loads the one or more EDIDs selected by the user selection unit among the plurality of EDIDs corresponding to the corresponding connector, from the main storage unit to the temporary storage unit.

8. A control method of a display apparatus which is capable of being coupled to a video signal supply source through a plurality of connectors, the control method comprising:

loading a plurality of extended display identification data (EDIDs) corresponding to the plurality of connectors from a main storage unit at the display apparatus to a temporary storage unit at the display apparatus if power is supplied; and transmitting an EDID corresponding to an EDID requesting signal from the display apparatus to an external video signal supply source coupled to the display apparatus through a corresponding connector among the one or more EDIDs loaded to the temporary storage unit, from the display apparatus to the video signal supply source through the corresponding connector if the EDID requesting signal is transmitted from the external video signal source through the corresponding connector.

9. The control method according to claim 8, further comprising, at the display apparatus, transmitting via an arbiter coupled between the temporary storage unit and the corresponding connector, the EDID loaded to the temporary storage unit to respective ones of the corresponding connector.

10. The control method according to claim 8, wherein the loading the EDID comprises receiving power from at least one of the display apparatus and the corresponding connector.

11. The control method according to claim 8, wherein the plurality of EDIDs stored in the main storage unit is transmitted to the temporary storage unit through an interface including an I2C port or a RS232 port.

12. The control method according to claim 8, further comprising selecting one of the plurality of EDIDs through a user selection unit of the display apparatus before loading the EDID if the plurality of EDIDs is stored in the main storage unit corresponding to the corresponding connector, wherein the loading the EDID comprises loading the EDID selected from the plurality of EDIDs to the temporary storage unit.

13. The control method according to claim 12, further comprising displaying a selection item on the plurality of EDIDs to be selected by the user selection unit.

* * * * *